US012796388B2

(12) United States Patent
Taoda

(10) Patent No.: US 12,796,388 B2
(45) Date of Patent: Nov. 10, 2026

(54) SUBSTRATE TRANSFER UNIT AND SUBSTRATE TRANSFER CONTROL METHOD

(71) Applicant: Tokyo Electron Limited, Tokyo (JP)

(72) Inventor: Isamu Taoda, Nirasaki City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 164 days.

(21) Appl. No.: 18/376,512

(22) Filed: Oct. 4, 2023

(65) Prior Publication Data

US 2024/0120228 A1 Apr. 11, 2024

(30) Foreign Application Priority Data

Oct. 6, 2022 (JP) ................................ 2022-161380

(51) Int. Cl.
*H10P 72/50* (2026.01)
*B25J 9/16* (2006.01)
(Continued)

(52) U.S. Cl.
CPC ............ *H10P 72/53* (2026.01); *B25J 9/1697* (2013.01); *B25J 13/088* (2013.01); *H10P 72/3302* (2026.01); *H10P 72/7602* (2026.01)

(58) Field of Classification Search
CPC ............. H01L 21/681; H01L 21/67742; H01L 21/68707; H01L 21/67259;
(Continued)

(56) References Cited

U.S. PATENT DOCUMENTS

2009/0087542 A1* 4/2009 Sasaki ..................... H10P 72/53 427/8
2010/0080444 A1* 4/2010 Yamaguchi ............. H10P 72/53 700/114

(Continued)

FOREIGN PATENT DOCUMENTS

JP 2018-171667 A 11/2018
JP 2020049568 A 4/2020

(Continued)

*Primary Examiner* — Khoi H Tran
*Assistant Examiner* — Sagar Kc
(74) *Attorney, Agent, or Firm* — Nath, Goldberg & Meyer; Jerald L. Meyer; Tanya E. Harkins

(57) ABSTRACT

A substrate transfer unit that transfers a substrate to a target transfer position includes a transfer mechanism having a portion where two arms are connected to each other by a shaft, an imager photographing the substrate, an image processor image-processing images, and a controller configured to perform feedback control of a drive mechanism such that when the substrate is transferred by a transfer mechanism, a shaft angle detected by a shaft angle detector reaches a target value, and perform correction of a feedback control based on image information obtained by image-processor. The transfer controller is further configured to perform the feedback control periodically, cause the imager and the image processor to perform the photographing and the image-processing in real time concurrently with the feedback control at least once for each feedback control, and perform the correction of the control operation whenever the feedback control is performed.

20 Claims, 7 Drawing Sheets

(51) Int. Cl.

| | |
|---|---|
| ***B25J 13/08*** | (2006.01) |
| ***H10P 72/30*** | (2026.01) |
| ***H10P 72/76*** | (2026.01) |

(58) Field of Classification Search

CPC .......... H01L 21/67766; H01L 21/67253; B25J 9/1697; B25J 13/088; B25J 9/043; B25J 9/1653; B25J 11/0095; B25J 13/08; B25J 19/02; G05B 2219/40301; H10P 72/53; H10P 72/3302; H10P 72/7602; H10P 72/0606; H10P 72/0604; H10P 72/3402

See application file for complete search history.

(56) References Cited

U.S. PATENT DOCUMENTS

| | | | | |
|---|---|---|---|---|
| 2012/0226382 | A1* | 9/2012 | Asada | B25J 9/1697 901/47 |
| 2014/0340509 | A1* | 11/2014 | Fairbairn | H04N 17/002 348/95 |
| 2015/0202774 | A1* | 7/2015 | Blank | H10P 72/50 700/254 |
| 2015/0241203 | A1* | 8/2015 | Jordil | G01B 5/0004 356/4.01 |
| 2017/0197795 | A1* | 7/2017 | Murao | B65G 43/00 |
| 2018/0194009 | A1* | 7/2018 | Kojima | B25J 9/0018 |
| 2019/0160664 | A1* | 5/2019 | Nakagawa | B25J 9/1692 |
| 2020/0094399 | A1* | 3/2020 | Shindo | B25J 9/042 |
| 2020/0269419 | A1* | 8/2020 | Imai | B25J 9/12 |
| 2020/0324410 | A1* | 10/2020 | Bergantz | B25J 9/1664 |
| 2022/0193858 | A1* | 6/2022 | Deshpande | B24B 49/12 |

FOREIGN PATENT DOCUMENTS

| | | | |
|---|---|---|---|
| JP | 2021048270 | A | 3/2021 |
| KR | 1020100016329 | A | 2/2010 |
| KR | 1020190099127 | A | 8/2019 |
| WO | 2016056117 | A1 | 4/2016 |
| WO | WO-2021054101 | A1 * | 3/2021 |

* cited by examiner

SUBSTRATE TRANSFER UNIT AND SUBSTRATE TRANSFER CONTROL METHOD

CROSS-REFERENCE TO RELATED APPLICATION

This application is based upon and claims the benefit of priority from Japanese Patent Application No. 2022-161380, filed on Oct. 6, 2022, the entire contents of which are incorporated herein by reference.

TECHNICAL FIELD

The present disclosure relates to a substrate transfer unit and a substrate transfer control method.

BACKGROUND

In a processing system that continuously processes a plurality of substrates, a transfer device is used to hold a substrate and transfer the held substrate to a predetermined module. Patent Document 1 describes a technique of controlling substrate transfer when a transfer device having a rotary shaft, such as an articulated arm, is used, in which a rotation angle is detected by an encoder of a rotary motor, and based on the detection, substrate transfer is controlled by, for example, PID control so that a substrate is transferred to a desired position.

In addition, Patent Document 2 describes the following position correction method for a substrate transfer device. That is, in this technique, a hand on which a substrate is placed is moved based on teaching data to move the substrate to a prescribed position above a substrate holder. Then, the central position of the substrate is detected from image data obtained by imaging the substrate placed on the hand stopped at the prescribed position by a camera, and the prescribed position is corrected such that the central position of the substrate approaches the central axis of the substrate holder, thereby correcting teaching data.

PRIOR ART DOCUMENTS

Patent Documents

Patent Document 1: Japanese Patent Laid-Open Publication No. 2020-49568

Patent Document 2: Japanese Patent Laid-Open Publication No. 2021-48270

SUMMARY

According to one embodiment of the present disclosure, there is provided a substrate transfer unit that transfers a substrate to a target transfer position, the substrate transfer unit including: a transfer mechanism having a portion where two arms are connected to each other by a shaft, the transfer mechanism being configured to hold and transfer the substrate; a drive mechanism configured to drive the transfer mechanism; a shaft angle detector configured to detect a shaft angle of the shaft when the transfer mechanism is driven by the drive mechanism; an imager configured to successively photograph the substrate which is being transferred by the transfer mechanism; an image processor configured to perform image-processing of images captured by the imager; and a transfer controller configured to: perform feedback control of the drive mechanism such that, when the substrate is transferred by the transfer mechanism, the shaft angle detected by the shaft angle detector reaches a target value obtained by calculation; and perform correction of a control operation of the feedback control based on image information obtained by image-processing the images captured by the imager by the image processor, wherein the transfer controller is further configured to: perform the feedback control periodically; cause the imager and the image processor to perform the photographing and the image-processing in real time concurrently with the feedback control at least once for each feedback control; and perform the correction of the control operation based on the image information whenever the feedback control is performed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the accompanying drawings.

<Substrate Processing System>

Figure 1:
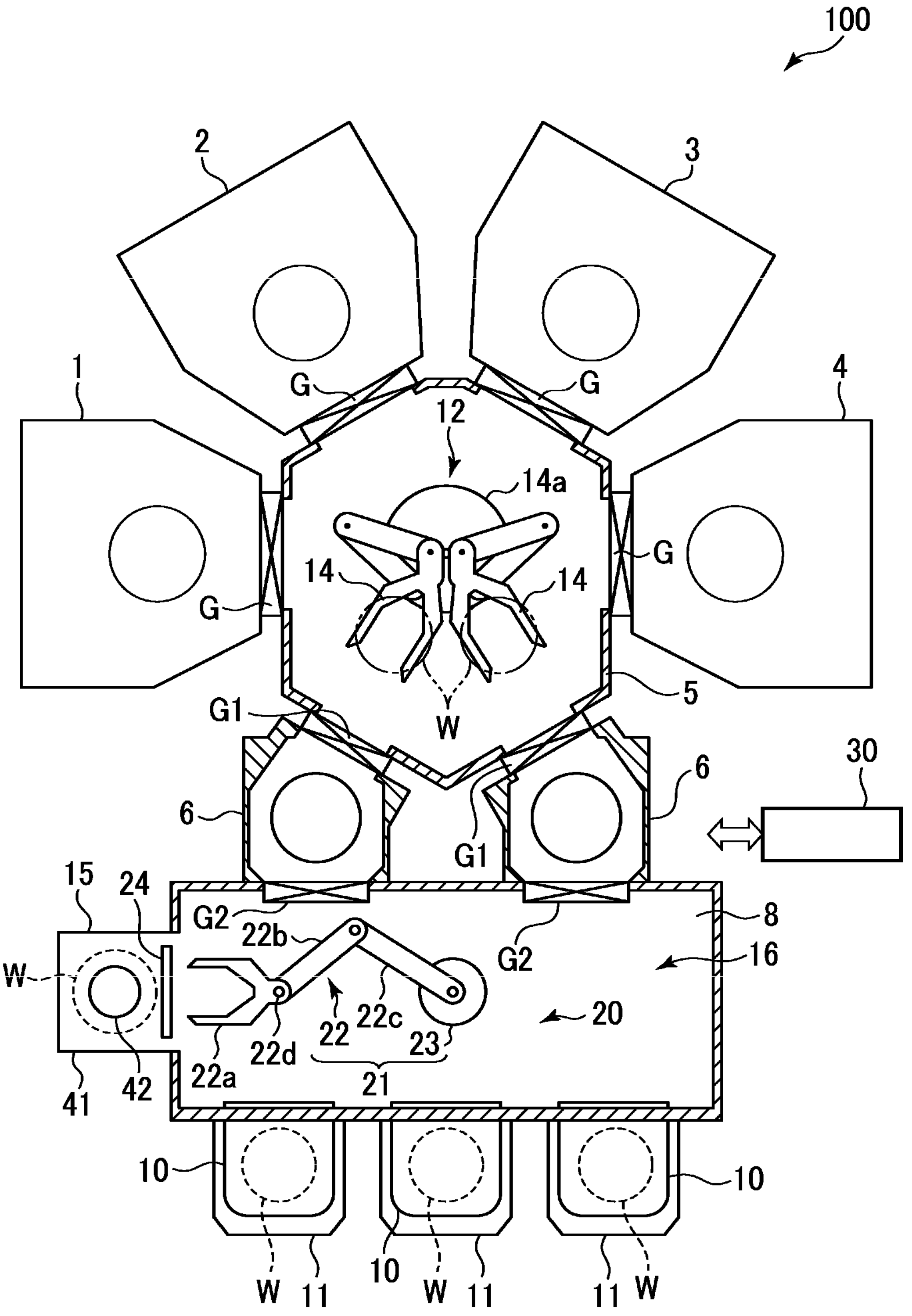
FIG. 1 is a horizontal cross-sectional view schematically illustrating a multi-chamber type substrate processing system provided with a substrate transfer unit according to an embodiment.

FIG. 1 is a horizontal cross-sectional view schematically illustrating a multi-chamber type substrate processing system provided with a substrate transfer unit according to an embodiment.

The substrate processing system 100 performs a predetermined vacuum process, such as film formation, on a substrate.

As illustrated in FIG. 1, the substrate processing system 100 includes a vacuum transfer module 5, processing modules 1, 2, 3, and 4, a vacuum transfer device 12, an atmospheric transfer module 8, two load-lock modules 6, three load ports 11, an aligner 15, a substrate transfer unit 20, and a controller 30.

The vacuum transfer module 5 is a housing having a hexagonal cross section, the interior of which is evacuated by a vacuum pump (not illustrated) to be maintained at a predetermined degree of vacuum, and a vacuum transfer device 12 is provided inside the vacuum transfer module 5. The processing modules 1 to 4 are connected to walls corresponding to the four sides of the vacuum transfer module 5, respectively. In addition, openings on one side of the two load-lock modules 6 are connected to the other two walls of the vacuum transfer module 5, respectively.

The four processing modules 1 to 4 perform vacuum processing, such as film formation, on the substrate W, and are connected to the corresponding wall portions of the vacuum transfer module 5 via gate valves G, respectively, so that the processing modules 1 to 4 are communicated with the vacuum transfer module 5 by opening the corresponding gate valves G, and shut off from the vacuum transfer module 5 by closing the corresponding gate valves G.

The atmospheric transfer module 8 is a rectangular housing in which a substrate transfer device 21 of the substrate transfer unit 20 is provided. The atmospheric transfer module 8 is configured as an EFEM, and a dry purge gas, such as nitrogen gas ($N_2$ gas), is circulated therein. A fan filter unit is provided in the upper portion of the atmospheric transfer module 8 such that a clean purge gas is supplied to the substrate transfer area of the atmospheric transfer module 8 as a downflow.

The openings on the other side of the two load-lock modules 6 are connected to one of the long-side walls of the atmospheric transfer module 8. Three load ports 11 are connected to the other long-side wall of the atmospheric transfer module 8. In addition, an aligner 15 is connected to one of the short-side walls of the atmospheric transfer module 8.

The two load-lock modules 6 are for enabling the transfer of substrates W between the atmospheric transfer module 8 which has atmospheric pressure and the vacuum transfer module 5 which has a vacuum atmosphere, and have a pressure that is variable between the atmospheric pressure and the same degree of vacuum as the vacuum transfer module.

The openings on one side of the load-lock modules 6 are connected to the corresponding walls of the vacuum transfer module 5 via gate valves G1, and the openings on the other side of the load-lock modules 6 are connected to one long-side wall of the atmospheric transfer module 8 via gate valves G2. The load-lock modules 6 communicate with the atmospheric transfer module 8 by opening the gate valves G2 after the interiors of the load-lock modules 6 are brought into the air atmosphere in the state in which the gate valves G1 and G2 are closed. In addition, the load-lock modules 6 communicate with the vacuum transfer module 5 by opening the gate valves G1 after the interiors of the load-lock modules 6 are brought into the vacuum atmosphere in the state in which the gate valves G1 and G2 are closed.

A FOUP 10, which is a substrate storage container configured to store a plurality of substrates, is placed on each load port 11, and the FOUP 10 placed on the load port 11 is configured to communicate with the interior of the atmospheric transfer module 8.

The aligner 15 connected to the atmospheric transfer module 8 includes a housing 41 and a station (pedestal) 42 configured to rotatably hold a substrate W within the housing 41, and is configured to align the substrate W in the state in which the substrate W is held by the station 42.

The vacuum transfer device 12 within the vacuum transfer module 5 carries substrates W into and out of the processing modules 1 to 4 and the load-lock modules 6, and includes two arms 14, each of which is capable of independently transferring substrates W, and a driver 14*a* of a multi-joint arm structure.

In addition, the substrate transfer device 21 in the atmospheric transfer module 8 is a component of the substrate transfer unit 20 of the present embodiment, and includes a transfer mechanism 22 having an arm that is turnable via a shaft, and a driver 23 that drives the transfer mechanism 22 and is capable of detecting the rotation angle of the arm. In the present example, the transfer mechanism 22 includes a holding arm (fork) 22*a* configured to hold a substrate and two intermediate arms 22*b* and 22*c*, and has a multi-joint arm structure in which these arms are connected via a shaft. The holding arm 22*a* and the intermediate arm 22*b* are rotatably connected to each other via a shaft 22*d*. A power transmission mechanism, such as a gear for transmitting power from the driver 23, is provided in the arms 22*b* and 22*c*. The substrate transfer device 21 transfers substrates W to the FOUPs 10 connected to the load ports 11, the aligner 15, and the load-lock modules 6. In the present embodiment, the substrate transfer unit 20 is configured to transfer a substrate W to the aligner 15 by the substrate transfer device 21, and further include a line camera 24 as an imager, an image processor, and a transfer controller (none of which is illustrate in FIG. 1). Details of the substrate transfer unit 20 will be described later.

The controller 30 includes a computer provided with a CPU and a storage, and the storage configured to control each component of the substrate processing system 100 stores a control program that gives commands to each component in order to execute predetermined processing in the substrate processing system 100, i.e., a processing recipe, various databases, and the like. In addition, the controller 30 includes a transfer controller which is a component of the substrate transfer unit 20 and controls substrate transfer.

In such a substrate processing system 100, the FOUPs 10 in which substrates W are accommodated are placed on the load ports 11, the substrates W in the FOUPs are taken out by the substrate transfer device 21 and transferred to the aligner 15 via the atmospheric transfer module 8, and the substrates after alignment of the substrates W are transferred to one of the load-lock modules 6 held in the atmospheric atmosphere. After the load-lock modules 6 in which the substrates W are accommodated are brought into a vacuum, the substrates W are transferred to one of the processing modules 1 to 4 by the vacuum transfer device 12, and the substrates W are subjected to predetermined processing such as film formation. After processing, the vacuum transfer device 12 transfers the substrates W to one of the load-lock modules 6 held in the vacuum, and after returning the interiors of the load-lock modules 6 to the atmospheric pressure, the substrates W therein are returned to the FOUPs 10 by the substrate transfer device 21.

<Substrate Transfer Unit>

Figure 2:
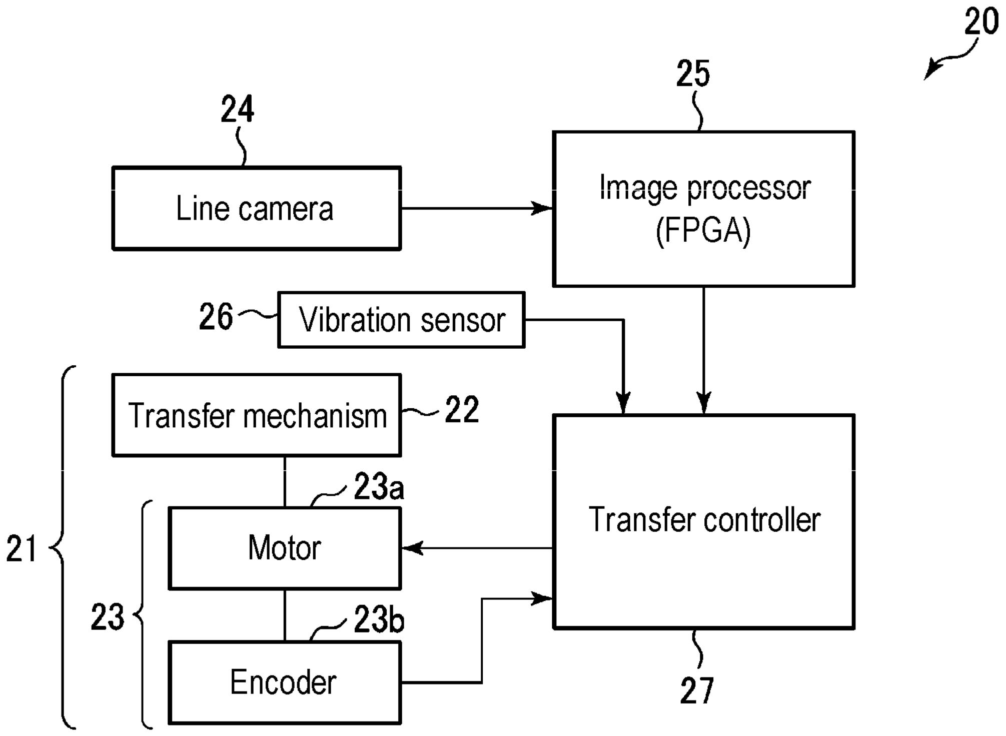
FIG. 2 is a schematic configuration view illustrating an example of the substrate transfer unit according to an embodiment.
Figure 3:
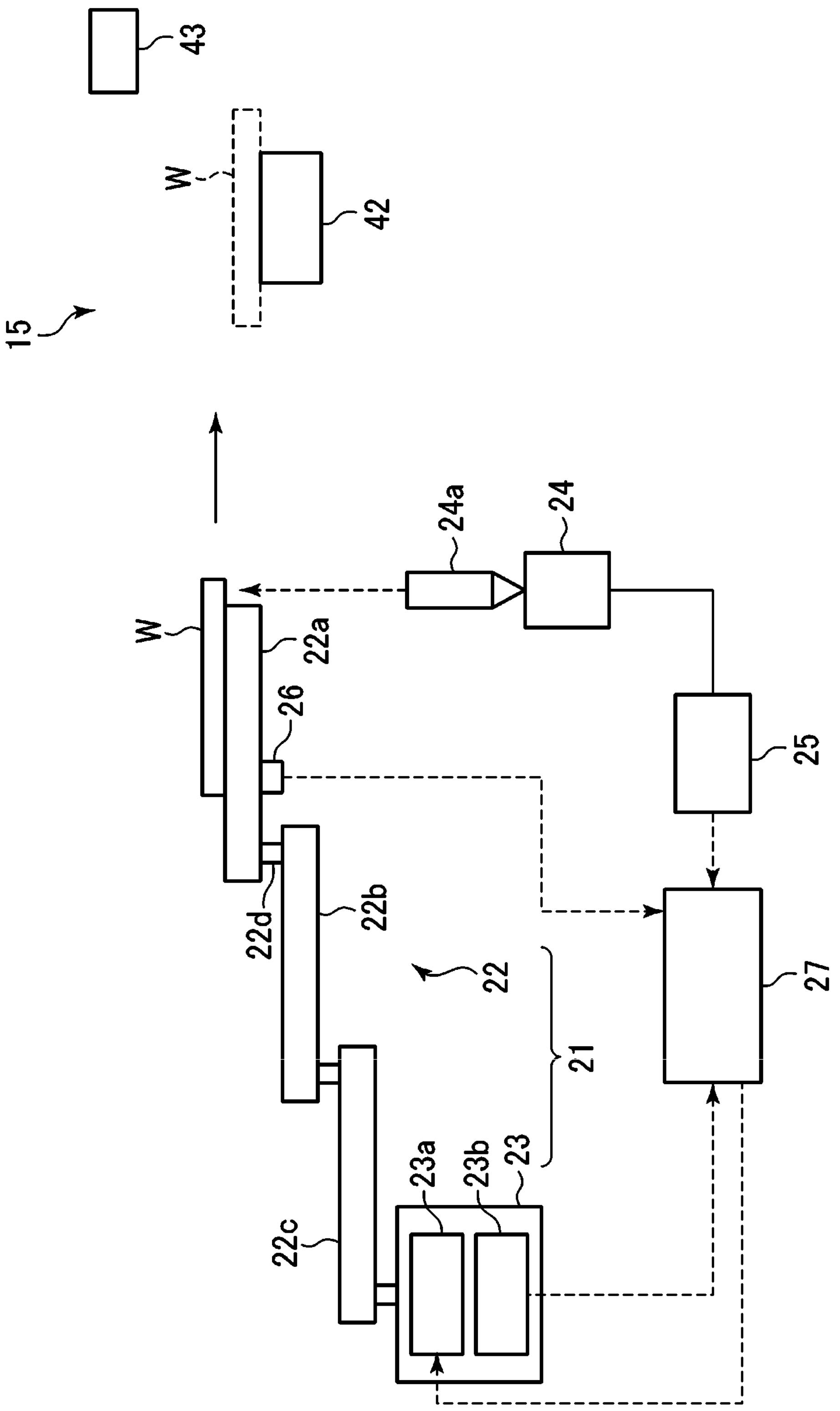
FIG. 3 is a side view illustrating the substrate transfer unit according to an embodiment.

Next, the substrate transfer unit 20 will be described. FIG. 2 is a schematic configuration view illustrating the substrate transfer unit 20, and FIG. 3 is a side view illustrating the substrate transfer unit 20.

As illustrated in FIG. 2, the substrate transfer unit 20 includes a substrate transfer device 21, a line camera 24, an image processor 25, a vibration sensor 26, and a transfer controller 27.

As described above, the substrate transfer device 21 includes the transfer mechanism 22 having an arm that is turnable via a shaft, and the driver 23 configured to drive the transfer mechanism 22. The transfer mechanism 22 includes a holding arm (fork) 22*a* that holds a substrate, and two intermediate arms 22*b* and 22*c* connected to each other via shafts. The holding arm 22*a* and the intermediate arm 22*b* are connected by a shaft 22*d*. The driver 23 includes a motor 23*a* as a drive mechanism for driving the transfer mechanism 22, and an encoder 23*b* configured to detect the rotation angle of the motor 23*a*. By detecting the rotation angle of the motor 23*a*, the encoder 23*b* functions as a shaft angle detector for detecting, for example, the shaft angle of the shaft 22*d* connecting the holding arm 22*a* and the intermediate arm 22*b* to each other.

The line camera 24 is configured as an imager that photographs a substrate W placed on the transfer mechanism 22 when the transfer mechanism 22 transfers the substrate W to the station 42 of the aligner 15 located at a transfer position. The line camera 24 is fixedly provided below the holding arm (fork) 22*a* that moves with the substrate W placed thereon within the aligner 15, and is capable of photographing the entire width of the substrate W when the substrate W is transferred. As illustrated in FIG. 3, the line camera 24 continuously photographs, via a lens 24*a*, the substrate W placed on the holding arm 22*a* that moves above the line camera during substrate transfer, at a speed higher than the control speed of the substrate transfer device 21 (e.g., 26,000 times per second (26,000 FPS)). In addition, as illustrated in FIG. 3, a sensor 43 configured to detect the position of the substrate W on the station 42 is provided in the aligner 15.

The image processor 25 is configured with an image-processing processor capable of image-processing images captured by the line camera 24 at high speed, such as a field programmable gate array (FPGA). For this reason, for example, it is possible to perform image-processing images captured at a high speed of 26,000 times per second (26,000 FPS) as described above. The image processor 25 feeds back image information to the transfer controller 27 as numerical values.

As illustrated in FIG. 3, the vibration sensor 26 is provided in the transfer mechanism 22 and detects shaking of the transfer mechanism 22.

The transfer controller 27 controls the substrate transfer device 21 so that a substrate W is transferred to a target transfer position (teaching position) on the station 42 obtained by teaching. Specifically, the transfer controller 27 detects the shaft angle (arm angle) of the shaft 22*d* of the transfer mechanism 22 by the encoder 23*b*, and performs feedback control of the motor 23*a* such that the angle reaches a target value obtained by calculation, and the transfer controller 27 performs correction of the control operation of the feedback control in real time based on the image information obtained by image-processing images captured by the line camera 24 by the image processor 25. Then, the feedback control and the correction of the control operation based on the image information are repeated before the substrate W is transferred to the target transfer position.

For example, PID control may be used for the feedback control. One feedback control is performed in an extremely short time of, for example, 125 μsec, and this control operation is repeated to transfer the substrate W to the station 42 by the transfer mechanism 22.

The transfer controller 27 causes the line camera 24 to perform image-capturing and image-processing at least once, for example, three times during one feedback control, and performs the correction of the control operation of the transfer mechanism 22 in real time for each feedback control based on the obtained image information. By repeating the control of the transfer mechanism 22 and the correction of the control operation by the transfer controller 27, the transfer mechanism 22 is capable of transferring the substrate W to the target transfer position of the station 42 with high accuracy.

When the transfer mechanism 22 transfers the substrate W, the control operation is performed 8,000 times per second if the control time per feedback control is 125 pec. Therefore, assuming that the transfer mechanism 22 takes 2 seconds to transfer the substrate W from the starting position to the target transfer position of the station 42, the control operation is performed 16,000 times. In this case, assuming that the photographing/image-processing capability is, for example, 26,000 FPS as described above, the photographing/image-processing can be performed 52,000 times in 2 seconds, and even if a calculation margin is considered, the photographing/image-processing can be performed three times in real time for one control operation.

As the correction of the control operation by the transfer controller 27, for example, correction of the control amount of a control parameter (PID parameter or the like) at the time of feedback control is performed.

In addition, when determining, from the image of the transfer mechanism 22, that the shaking of the transfer mechanism 22 in the horizontal direction (the X-Y direction) is greater than or equal to a set value or when determining, from the detection value of the vibration sensor 26, that the shaking of the transfer mechanism 22 in the height direction (the Z direction) of the transfer mechanism 22 is greater than or equal to a set value, the transfer controller 27 determines that there is "shaking" and performs, for example, control to reduce the gain of the motor 23*a*.

<Substrate Transfer Control Method>

Next, a substrate transfer control method when transferring a substrate by the substrate transfer unit 20 will be described.

Figure 4:
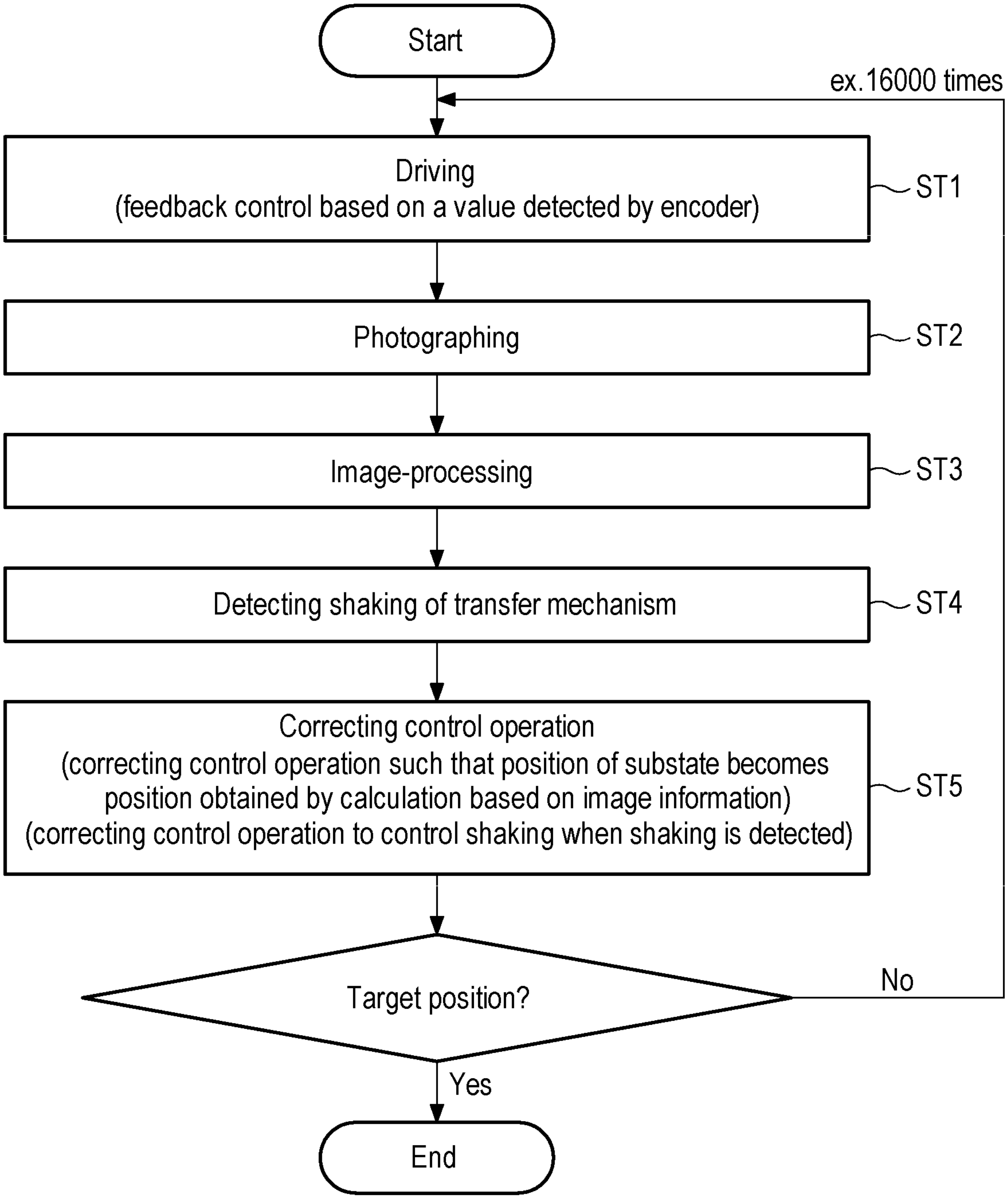
FIG. 4 is a flowchart illustrating a substrate transfer control method when a substrate is transferred by the substrate transfer unit.

FIG. 4 is a flowchart illustrating a substrate transfer control method when a substrate is transferred by the substrate transfer unit 20. In the present embodiment, the substrate transfer control is performed by the transfer controller 27.

First, the transfer mechanism 22 holding a substrate is driven (step ST1). At this time, in the state in which the substrate W is placed on the holding arm (fork) 22*a* of the transfer mechanism 22, feedback control of the substrate transfer device 21 is performed based on a detected value of a shaft angle detected by the encoder 23*b*. In this control, the encoder 23*b* detects the angle of the shaft 22*d* of the transfer mechanism 22 (i.e., the angle between the holding arm 22*a* and the intermediate arm 22*b*), and controls the motor 23*a* such that the angle reaches a target value obtained by calculation. The control at this time is performed by, for example, PID control. One PID control operation is performed in an extremely short time of, for example, 125 μsec.

Concurrently with the operation of controlling and driving the transfer mechanism 22 in step ST1, the line camera 24 photographs the substrate W on the transfer mechanism 22 (the holding arm 22*a*) in real time (step ST2), and the captured images are successively image-processed by the image processor 25 (step ST3).

In this case, the photographing in step ST2 and the image-processing in step ST3 are successively performed at least once, for example, three times, during one control operation of the transfer mechanism 22. Assuming that the time required for one control operation in step ST1 is 125 μsec, for example, assuming that the time required to perform photographing and image-processing once is 38 μsec, thus a total of 114 μsec is required to perform photographing/image-processing three times and the remaining 11 μsec is a time for calculation, image information can be obtained three times in the time for one control operation.

Concurrently with the control operation of step ST1, detection of the shaking of the transfer mechanism 22 is performed (step ST4). The shaking of the transfer mechanism 22 in the horizontal direction (the X-Y direction) can be detected from the image of the transfer mechanism 22, and the shaking in the height direction (the Z direction) can be detected by the vibration sensor 26. When determining, from the image of the transfer mechanism 22, that the shaking of the transfer mechanism 22 in the horizontal direction (the X-Y direction) is greater than or equal to a set value or determining, from the detection value of the vibration sensor 26, that the shaking of the transfer mechanism 22 in the height direction (the Z direction) is greater than or equal to the set value, the transfer controller determines that there is "shaking".

Next, the correction of the control operation during the feedback control of the transfer mechanism 22 is performed (step ST5). Specifically, based on the image information obtained by the photographing in step ST2 and digitized by the image-processing in step ST3, correction of the control operation, for example, correction of the control amount of a control parameter (a PID parameter and the like) during feedback control is performed in real time such that the position of the substrate W becomes a position obtained by calculation.

As a specific example, when the center position of the substrate W is in a position where the operation amount of the transfer mechanism 22 is determined to be small with respect to a calculated target trajectory, correction in a direction of removing the control filter of the motor 23*a* or correction to increase the I (integral) parameter and the D (differential) parameter among the PID parameters is performed. On the other hand, when the center position of the substrate W is in a position where the operation amount of the transfer mechanism 22 is determined to be large with respect to the calculated target trajectory, correction is performed in a manner opposite to that in the case where the operation amount is determined to be small.

In addition, when the shaking of the transfer mechanism 22 in the horizontal direction (the X-Y directions) is detected from the image information and the shaking of the transfer mechanism 22 in the height direction (the Z direction) is detected by the vibration sensor 26, correction such as lowering a gain of the motor 23*a* is performed in real time to suppress the shaking. At this time, when the gain of the motor 23*a* is lowered too much, the transfer time is prolonged and the throughput is lowered. Thus, it is preferable to limit the gain to a value that does not excessively decrease the throughput.

The operations of steps ST1 to ST5 are repeated to transfer the substrate W, and when the position of the substrate W reaches the target transfer position on the station 42, the control is terminated, and the substrate W is delivered onto the station 42. At this time, it can be identified by the line camera 24 and the sensor 43 whether the substrate W has been correctly transferred to the target transfer position.

Figure 5A:
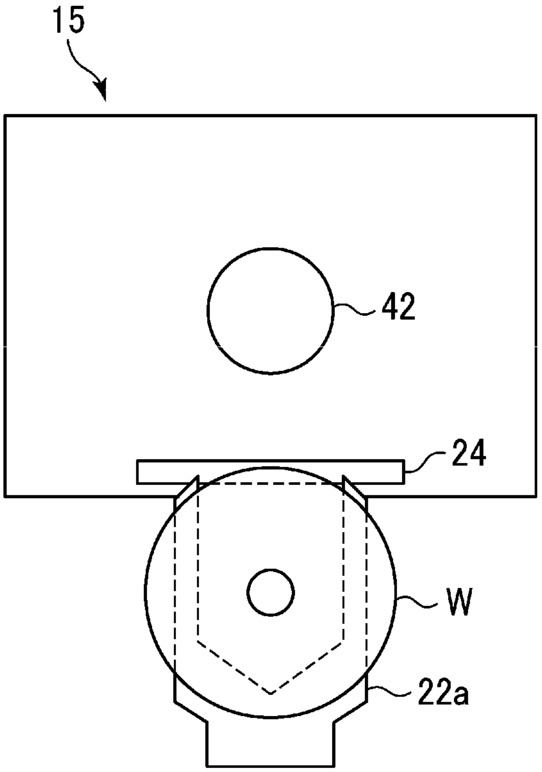
FIGS. 5A and 5B are plan views illustrating the transfer state of a substrate by a transfer mechanism.
Figure 5B:
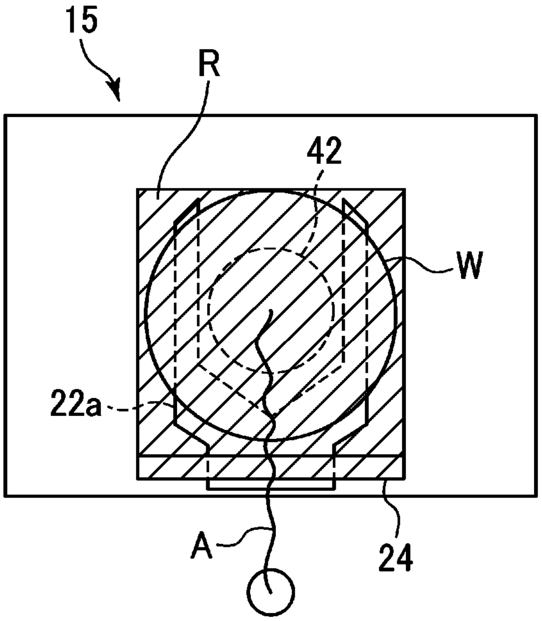

The transfer of the substrate W under such control is performed as illustrated in FIGS. 5A and 5B. FIGS. 5A and 5B are plan views illustrating the transfer state of a substrate W by the transfer mechanism 22. In a state in which a substrate W is placed on the holding arm (fork) 22*a* of the transfer mechanism 22, the substrate transfer unit 20 transfers the substrate W from a starting position illustrated in FIG. 5A to the station 42 as illustrated in FIG. 5B, passing above the line camera 24. The shaded portion in FIG. 5B is a photographed region R by the line camera 24, and the line camera 24 photographs almost the entire substrate W which is being transferred. The line A is the trajectory of the center of the substrate W photographed by the line camera 24.

In the present embodiment, as described above, the substrate W can be accurately transferred to the target transfer position (teaching position) on the station 42 obtained by teaching by performing correction of a control operation based on image information whenever the feedback control of the transfer mechanism 22 is performed.

The control result obtained by the substrate transfer control with correction based on the image information as described above is stored in the transfer controller 27, and can be reflected in control of transfer of the substrate W to the station in another module. As a result, the transfer control of the substrate to the station of another module can also be performed with high accuracy so that the substrate W can be transferred to the target transfer position with high accuracy.

Figure 6:
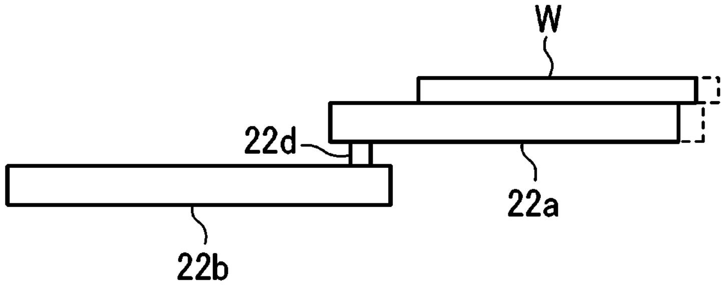
FIG. 6 is an explanatory view illustrating that an actual center position of a substrate on a holding arm is shifted from a center position obtained by calculation.

Next, the correction of the control operation based on image information in the present embodiment will be described in more detail. When the encoder 23*b* detects the shaft angle (arm angle) of the shaft 22*d* and feedback-control is performed to the motor 23*a* such that the detected value reaches a target value obtained by calculation, the shaft 22*d* of the arm used for control is located at a position spaced away from the substrate W on the holding arm (fork) 22*a*, as illustrated in FIG. 6. Therefore, due to a mechanical error, thermal expansion of the arm, and the like, a deviation illustrated by the broken line occurs, and the actual center position of the substrate W on the holding arm 22*a* in the transfer mechanism 22 deviates from the center position obtained by calculation.

Figure 7:
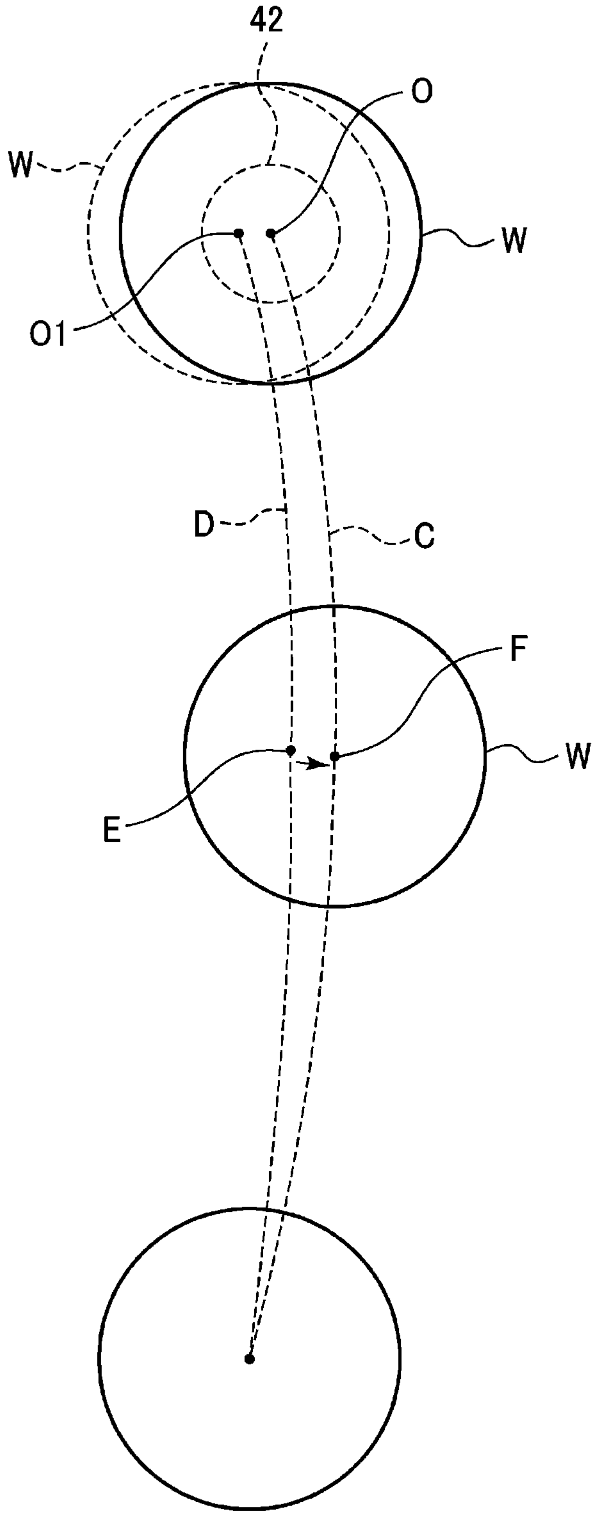
FIG. 7 is a view illustrating an actual control trajectory and a target control trajectory when feedback control of the center position of a substrate is performed such that a shaft angle reaches a target value obtained by calculation.

In such a case, as illustrated in FIG. 7, the actual control trajectory D of the center position of the substrate W deviates from the target control trajectory C obtained by calculation, and the center position of the substrate W on the station 42 becomes O1, which deviates from the target transfer position O. That is, sufficient transfer accuracy may not be obtained only with feedback control based on calculation using the angle of the arm shaft.

In contrast, in the present embodiment, the actual position (center position) of the substrate W can be determined by acquiring the image information of the substrate W on the holding arm (fork) 22*a* of the transfer mechanism 22 in real time each time the feedback control is repeatedly performed. Further, the control operation, for example, the control amount of the feedback control of the transfer mechanism 22 is corrected in real time such that the actual position (center position) of the substrate W reaches the target control position obtained by calculation. That is, the deviation of the actual position (center position) of the substrate W from the position of the target control trajectory C is calculated from the image information, and the control operation, for example, the control amount of the feedback control of the transfer mechanism 22 is corrected in real time to eliminate the deviation.

As a specific example, as illustrated in FIG. 7, when the actual center position of the substrate W based on the image information obtained in real time is a point E at a given feedback control timing, the control amount during the feedback control is corrected in real time such that the center position of the substrate W reaches a point F on the target control trajectory C.

By repeating such feedback control of the transfer mechanism 22 and correction of the control operation (control amount) in real time based on the image information, the substrate W can be transferred such that the center position of the substrate W follows the target control trajectory C. Therefore, the substrate W can be transferred, with high accuracy, to the target transfer position (teaching position) on the station 42 obtained by teaching. Whereas the transfer position error in a case of using only feedback control based on calculation using the shaft angle of the arm is, for example, within the range of 1.0 mmφ, but in the present embodiment, the error can be reduced within the range of 0.1 mmφ, which is 1/10 of the above-mentioned range.

Therefore, even if the substrate transfer device 21 deteriorates over time or the environmental temperature changes, the transfer accuracy can be maintained at a high level.

In addition, in the present embodiment, the shaking of the transfer mechanism 22 in the horizontal direction (the X-Y direction) is detected based on the image information, the shaking of the transfer mechanism 22 in the height direction (the Z direction) is detected by the vibration sensor 26, and the control operation is corrected in real time such that the shaking is suppressed. Therefore, even if the substrate transfer device 21 tends to be shaken due to deterioration over time, the shaking can be suppressed and the substrate can be transferred with high accuracy.

In the present embodiment, in one control operation of the feedback control based on the calculation using the shaft angle of the arm, it is sufficient to acquire the image information at least once in real time, but as the number of times of acquisition increases, the correction accuracy can be increased. In the above example, since image information is acquired three times in one control operation, high correction accuracy can be obtained.

In addition, the above-described Patent Document 2 describes that the image data of a substrate is acquired when controlling the substrate transfer device, but the image data is used to correct the teaching data by detecting the center position of the substrate and correcting the prescribed position such that the center position of the substrate approaches the center axis of the substrate holder. Accordingly, this technique is different from the technique of correcting a control operation in real time based on image information during the feedback control of a transfer mechanism as in the present disclosure.

<Other Applications>

Although an embodiment has been described above, it should be considered that the embodiment disclosed herein is exemplary in all respects and is not restrictive. Various types of omissions, substitutions, and changes may be made to above-described embodiment without departing from the scope and spirit of the appended claims.

For example, in the above-described embodiment, a substrate transfer unit, which transfers a substrate to an aligner in a multi-chamber type substrate processing system, has been illustrated as an example, but the present disclosure is not limited thereto and is applicable to the case where a substrate is transferred to a target transfer position, such as a station of another module. In addition, the transfer mechanism is not limited to that described in the above embodiment, and any transfer mechanism having a shaft, of which the angle is detectable, may be used.

In addition, the above-described embodiment illustrates an example in which the shaking of the transfer mechanism in the plane direction is determined from image information, the shaking of the transfer mechanism in the height direction is determined from the detection value detected by the vibration sensor, and correction is performed to suppress the shaking, but these are not essential. Either shaking may be determined and suppressed, or only the position correction may be performed when correcting the control operation in the feedback control without determining the shaking.

According to the present disclosure, there are provided a substrate transfer unit and a substrate transfer control method that can maintain high transfer accuracy even when a substrate transfer device that transfers substrates deteriorates over time or changes in environmental temperature occur.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transfer unit that transfers a substrate to a target transfer position, the substrate transfer unit comprising:

a transfer mechanism having a portion where two arms are connected to each other by a shaft, the transfer mechanism being configured to hold and transfer the substrate;

a drive mechanism configured to drive the transfer mechanism;

a shaft angle detector configured to detect a shaft angle of the shaft when the transfer mechanism is driven by the drive mechanism;

an imager configured to successively photograph the substrate, which is being moved by the transfer mechanism during substrate transfer, throughout the transfer of the substrate from a starting position to the target transfer position;

an image processor configured to perform image-processing of images of the substrate being moved that are captured by the imager; and a transfer controller configured to:

perform feedback control of the drive mechanism such that, when the substrate is transferred by the transfer mechanism, the shaft angle detected by the shaft angle detector reaches a target value obtained by calculation; and perform correction of a control operation of the feedback control based on image information obtained by image-processing the images of the substrate being moved that are captured by the imager by the image processor, wherein the transfer controller is further configured to:

perform the feedback control periodically;

cause the imager and the image processor to perform the photographing and the image-processing in real time concurrently with the feedback control at least once for each feedback control; and perform the correction of the control operation based on the image information whenever the feedback control is performed.

2. The substrate transfer unit of claim 1, wherein the drive mechanism includes a motor, and the shaft angle detector includes an encoder configured to detect a rotation angle of the motor.

3. The substrate transfer unit of claim 1, wherein the imager is fixedly provided such that the substrate placed on the transfer mechanism passes above the imager when the substrate is transferred by the transfer mechanism.

4. The substrate transfer unit of claim 3, wherein the imager is a line camera capable of photographing an entire width of the substrate when the substrate is being transferred.

5. The substrate transfer unit of claim 1, wherein the transfer controller is configured to perform the feedback control by PID control.

6. The substrate transfer unit of claim 1, wherein the transfer controller corrects a control amount of a control parameter as the correction of the control operation.

7. The substrate transfer unit of claim 1, wherein the transfer controller causes the photographing and the image-processing to be performed three times for one feedback control.

8. The substrate transfer unit of claim 7, wherein the feedback control is performed 8,000 times per second, and the photographing and the image-processing are performed 26,000 times per second.

9. The substrate transfer unit of claim 1, wherein the transfer controller is further configured to determine shaking of the transfer mechanism in a horizontal direction based on the image information, and to control the transfer mechanism to suppress the shaking.

10. The substrate transfer unit of claim 9, further comprising:

a vibration sensor configured to detect shaking of the transfer mechanism in a height direction, wherein the transfer controller is further configured to determine the shaking of the transfer mechanism in the height direction by the vibration sensor, and to control the transfer mechanism to suppress the shaking.

11. A method of transferring a substrate to a target transfer position, the method comprising:

driving a transfer mechanism having a portion where two arms are connected by a shaft and holding the substrate while performing a control operation of controlling the transfer mechanism being controlled by feedback control such that a shaft angle of the shaft reaches a target value obtained by calculation;

successively photographing the substrate being moved by the transfer mechanism during substrate transfer in real time concurrently with the driving of the transfer mechanism, throughout the transfer of the substrate from a starting position to the target transfer position;

image-processing an image of the substrate being moved that is captured in the photographing by an image processor, continuously with the photographing; and correcting the control operation such that a position of the substrate becomes a position obtained by calculation based on image information obtained by image-processing the image of the substrate being moved, wherein the feedback control is performed periodically, the photographing and the image-processing are performed in real time concurrently with the feedback control at least once for each feedback control, and the correcting of the control operation based on the image information is performed whenever the feedback control is performed.

12. The method of claim 11, wherein the transfer mechanism is driven by a motor, and the shaft angle is detected by an encoder configured to detect a rotation angle of the motor.

13. The method of claim 11, wherein the photographing is performed by an imager that is fixedly provided such that the substrate placed on the transfer mechanism passes above the imager when the substrate is transferred by the transfer mechanism.

14. The method of claim 11, wherein the feedback control is performed by PID control.

15. The method of claim 11, wherein in the correcting of the control operation, correction of a control amount of a control parameter is performed.

16. The method of claim 15, wherein the photographing and the image-processing are performed three times for each feedback control.

17. The method of claim 16, wherein the feedback control is performed 8,000 times per second, and the photographing and the image-processing are performed 26,000 times per second.

18. The method of claim 11, further comprising performing detection of shaking of the transfer mechanism concurrently with the feedback control, wherein, in the correcting of the control operation, the control operation is corrected to suppress the shaking when the shaking is detected.

19. The method of claim 18, wherein the detection of shaking of the transfer mechanism is performed by detecting the shaking of the transfer mechanism in a horizontal direction from the image information.

20. The method of claim 18, wherein the detection of the shaking of the transfer mechanism is performed by detecting the shaking of the transfer mechanism in a height direction by a vibration sensor.

* * * * *